(12) United States Patent
Venema

(10) Patent No.: US 7,528,933 B2
(45) Date of Patent: May 5, 2009

(54) LITHOGRAPHIC APPARATUS AND DEVICE MANUFACTURING METHOD UTILIZING A MEMS MIRROR WITH LARGE DEFLECTION USING A NON-LINEAR SPRING ARRANGEMENT

(75) Inventor: Willem Jurrianus Venema, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 344 days.

(21) Appl. No.: 11/398,761

(22) Filed: Apr. 6, 2006

(65) Prior Publication Data
US 2007/0236675 A1    Oct. 11, 2007

(51) Int. Cl.
*G03B 27/54*    (2006.01)
(52) U.S. Cl. .................. 355/53; 359/290; 359/291; 359/221; 359/223; 359/224; 355/67; 355/75
(58) Field of Classification Search .................. 355/67, 355/290, 291, 221, 223, 224
See application file for complete search history.

(56) References Cited

U.S. PATENT DOCUMENTS

| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,535,319 B2 * | 3/2003 | Buzzetta et al. ............. 359/225 |
| 6,687,041 B1 | 2/2004 | Sandstrom |
| 6,747,783 B1 | 6/2004 | Sandstrom |
| 6,760,144 B2 * | 7/2004 | Hill et al. .................... 359/290 |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2002/0149071 A1 * | 10/2002 | Shim .......................... 257/415 |
| 2004/0041104 A1 | 3/2004 | Liebregts et al. |
| 2004/0061917 A1 * | 4/2004 | Mushika et al. ............. 359/223 |
| 2004/0130561 A1 | 7/2004 | Jain |
| 2004/0245889 A1 * | 12/2004 | Miller et al. ................ 310/309 |
| 2005/0007572 A1 | 1/2005 | George et al. |
| 2005/0024613 A1 | 2/2005 | Bleeker et al. |
| 2005/0024643 A1 | 2/2005 | Bleeker et al. |
| 2005/0152017 A1 * | 7/2005 | Reboa ......................... 359/251 |
| 2005/0179882 A1 | 8/2005 | Gui et al. |
| 2005/0219497 A1 | 10/2005 | Bleeker |
| 2005/0270515 A1 | 12/2005 | Troost et al. |
| 2006/0038969 A1 | 2/2006 | Baselmans et al. |

FOREIGN PATENT DOCUMENTS

| WO | WO 98/33096 | 7/1998 |
| WO | WO 98/38597 | 9/1998 |

* cited by examiner

Primary Examiner—Diane I Lee
Assistant Examiner—Mesfin T Asfaw
(74) Attorney, Agent, or Firm—Sterne, Kessler, Goldstein & Fox P.L.L.C.

(57) ABSTRACT

An array of individually controllable elements for a lithographic apparatus comprise reflectors that can be actuated by an actuator and are biased to return to a given position by a force that varies non-linearly with the displacement of the reflector from that position.

15 Claims, 11 Drawing Sheets

LITHOGRAPHIC APPARATUS AND DEVICE MANUFACTURING METHOD UTILIZING A MEMS MIRROR WITH LARGE DEFLECTION USING A NON-LINEAR SPRING ARRANGEMENT

BACKGROUND

1. Field of the Invention

The present invention relates to a lithographic apparatus, an array of individually controllable elements and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

One type of known array of individually controllable elements include arrays of small mirrors. Each of the mirrors is arranged such that it can rotate about a hinge and is associated with an actuator for pivoting the mirror. A lithographic apparatus utilizing such an array of individually controllable elements can be configured such that when each mirror is in a first position, radiation impinging upon it from an illumination system is reflected into an aperture of the projection system. When the mirror is in a second position, the radiation is reflected away from the aperture of the projection system. Accordingly, by setting some mirrors to the first position and some mirrors to the second position, it is possible to modulate the beam of radiation projected onto a substrate by the projection system, thereby enabling the exposure of a pattern on the substrate.

It has further been proposed to configure the array of individually controllable elements such that the mirror can be set to intermediate positions between the first and second positions. At such intermediate positions the radiation directed to the aperture of the projection system by each mirror can be of a correspondingly intermediate radiation intensity. Accordingly, it is possible to project onto the substrate a pattern of radiation that includes gray tones and/or it is possible to use grayscale radiation intensity control in order to finely adjust the position of the boundaries of pattern features formed on the substrate.

However, known arrays of individually controllable elements use electrostatic actuators in order to control the position of the mirrors. Such actuators are adequate for controlling the position of the mirrors between first and second positions, corresponding to substantially all incident radiation or substantially no radiation being directed to the aperture of the projection system. This is because in such arrangements the precise position of the mirror is not critical. However, where intermediate mirror positions are to be used in order to provide grayscale control, the precise position of the mirror is important because it determines the intensity of the radiation directed into the projection system. Furthermore, the relationship between the voltage applied to the electrostatic actuator and the displacement of the mirror is non-linear. Accordingly, the control system is necessarily complex because for each mirror, a required corresponding intensity of radiation at the substrate will need to be converted to a required voltage, necessary to generate a given displacement of the mirror that directs a given intensity of radiation into the projection system. As a result of the non-linear relationship between the voltage and the displacement of the mirror, this determination is computationally complex or may be performed by lookup tables, thus requiring a significant amount of memory. This can be especially significant because each mirror can respond differently and therefore can require its own lookup table. Furthermore, the configuration can be unstable and, above a given voltage applied to the actuator or a given displacement of the mirror, the mirror will snap through.

Therefore, what is needed is a system and method for controlling arrays of individually controllable elements.

SUMMARY

In one embodiment of the present invention, there is provided an array of individually controllable elements, adapted to modulate a beam of radiation. The individually controllable elements comprise a reflector, movably mounted to the array such that it is biased away from a first position towards a second position and an actuator, capable of exerting a force on the reflector in order to urge it away from the second position towards the first position. A force exerted on the reflector in order to bias the reflector away from the first position towards the second position is non-linearly related to the displacement of the reflector from the second position.

In another embodiment of the present invention, there is provided a lithographic apparatus, comprising an array of individually controllable elements that is configured to modulate a beam of radiation before it is projected onto a substrate. The individually controllable elements comprise a reflector, movably mounted to the array such that it is biased away from a first position towards a second position and an actuator, capable of exerting a force on the reflector in order to urge it away from the second position towards the first position. A force exerted on the reflector in order to bias the reflector away from the first position towards the second position is non-linearly related to the displacement of the reflector from the second position.

In a further embodiment of the present invention, there is provided a device manufacturing method comprising the following steps. Projecting a modulated beam of radiation onto a substrate. Before being projected, the beam of radiation is modulated using an array of individually controllable elements. The individually controllable elements comprises a reflector, movably mounted to the array such that it is biased away from a first position towards a second position and an actuator, capable of exerting a force on the reflector in order to urge it away from the second position towards the first position. A force exerted on the reflector in order to bias the reflector away from the first position towards the second position is non-linearly related to the displacement of the reflector from the second position. Control signals are sent to the actuators of the individually controllable elements in order to set the reflectors to desired displacements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings. In the drawings, like reference numbers can indicate identical or functionally similar elements.

Figure 1:
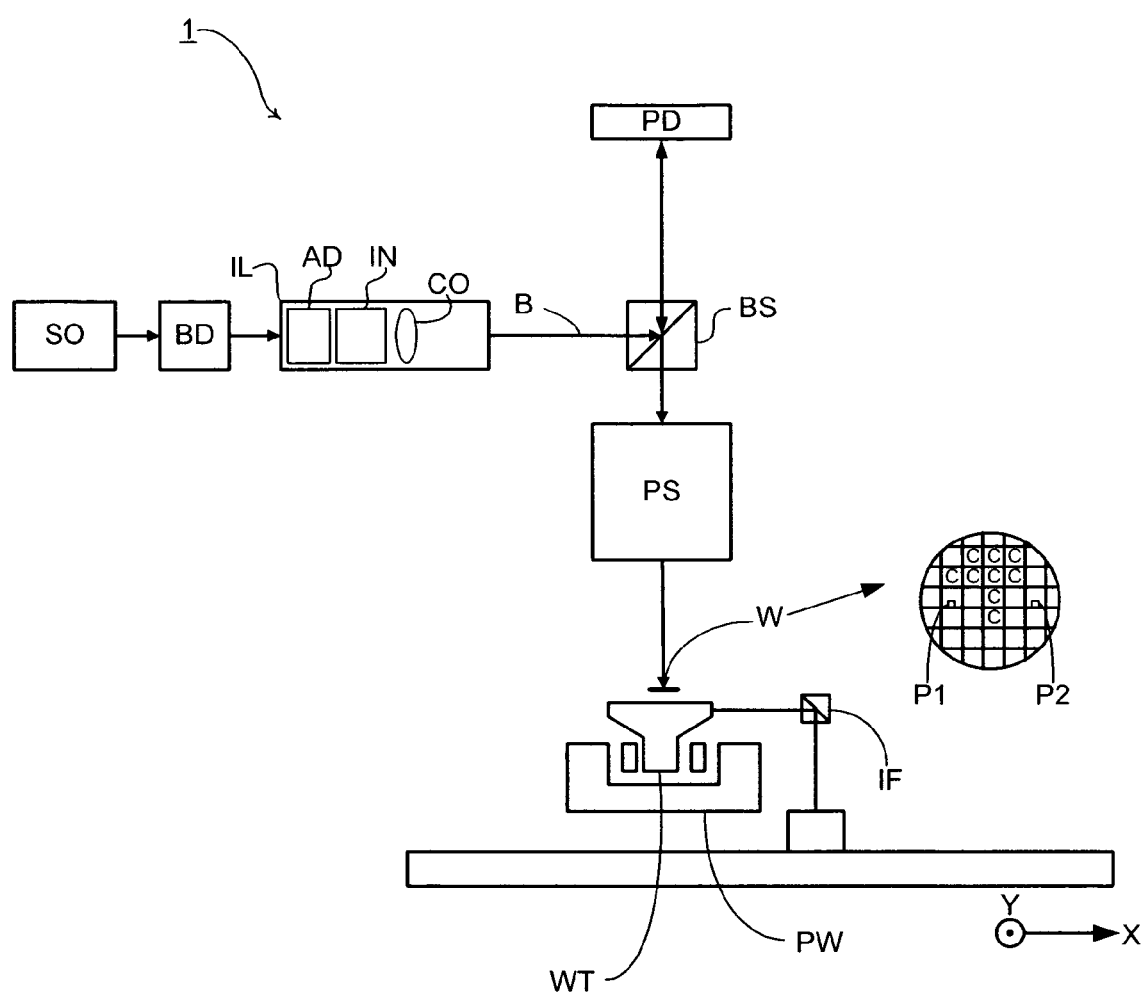
FIGS. 1 and 2 depict lithographic apparatus, according to various embodiments of the present invention.

Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. The thickness of the substrate can be at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
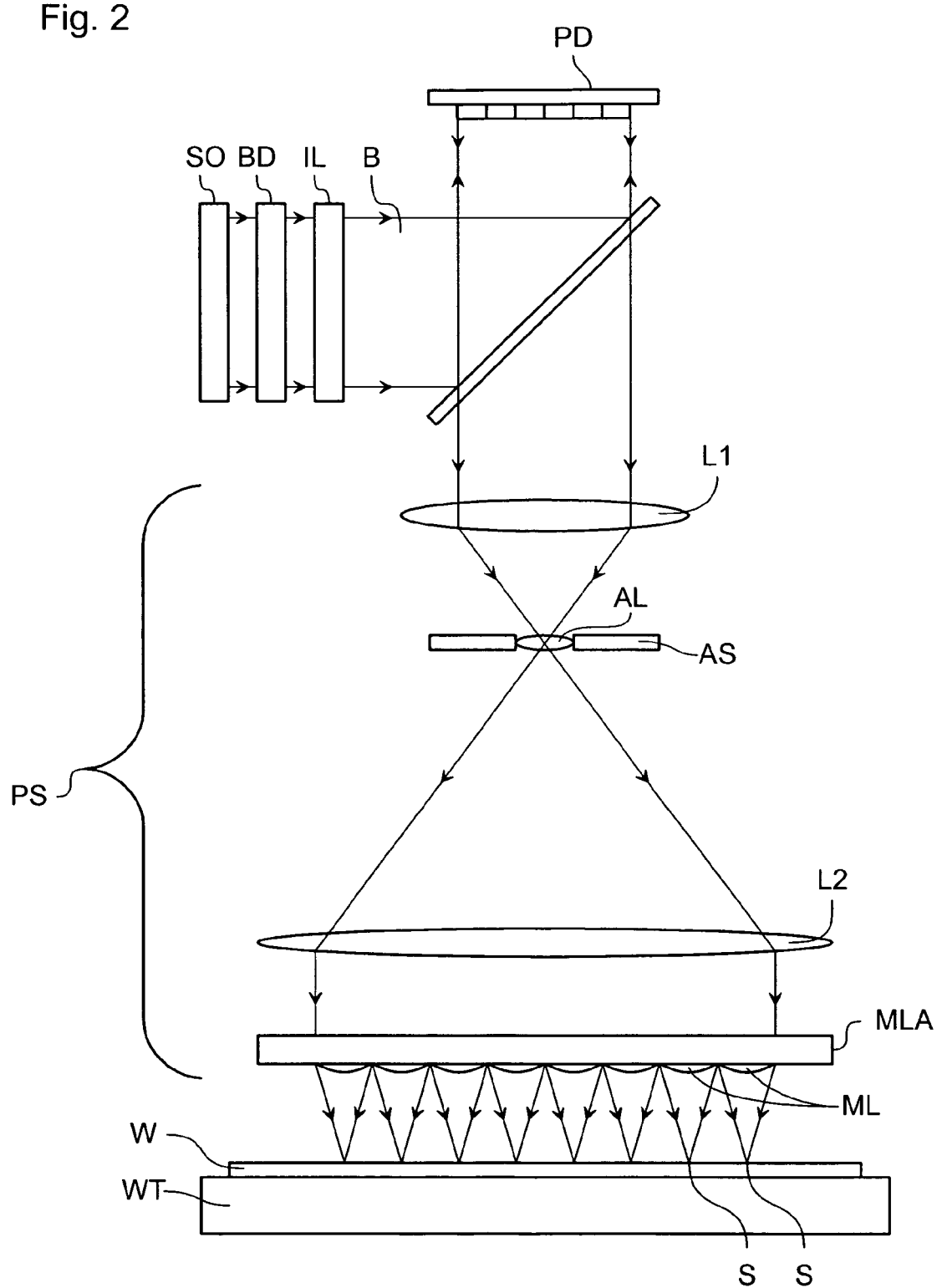

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.
4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.
5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although Ably eight lenses of the illustrated array of lenses 14 are shown, the array of lenses can comprise many thousands of lenses (the same is true of the array of individually controllable elements used as the patterning device PD).

Figure 3:
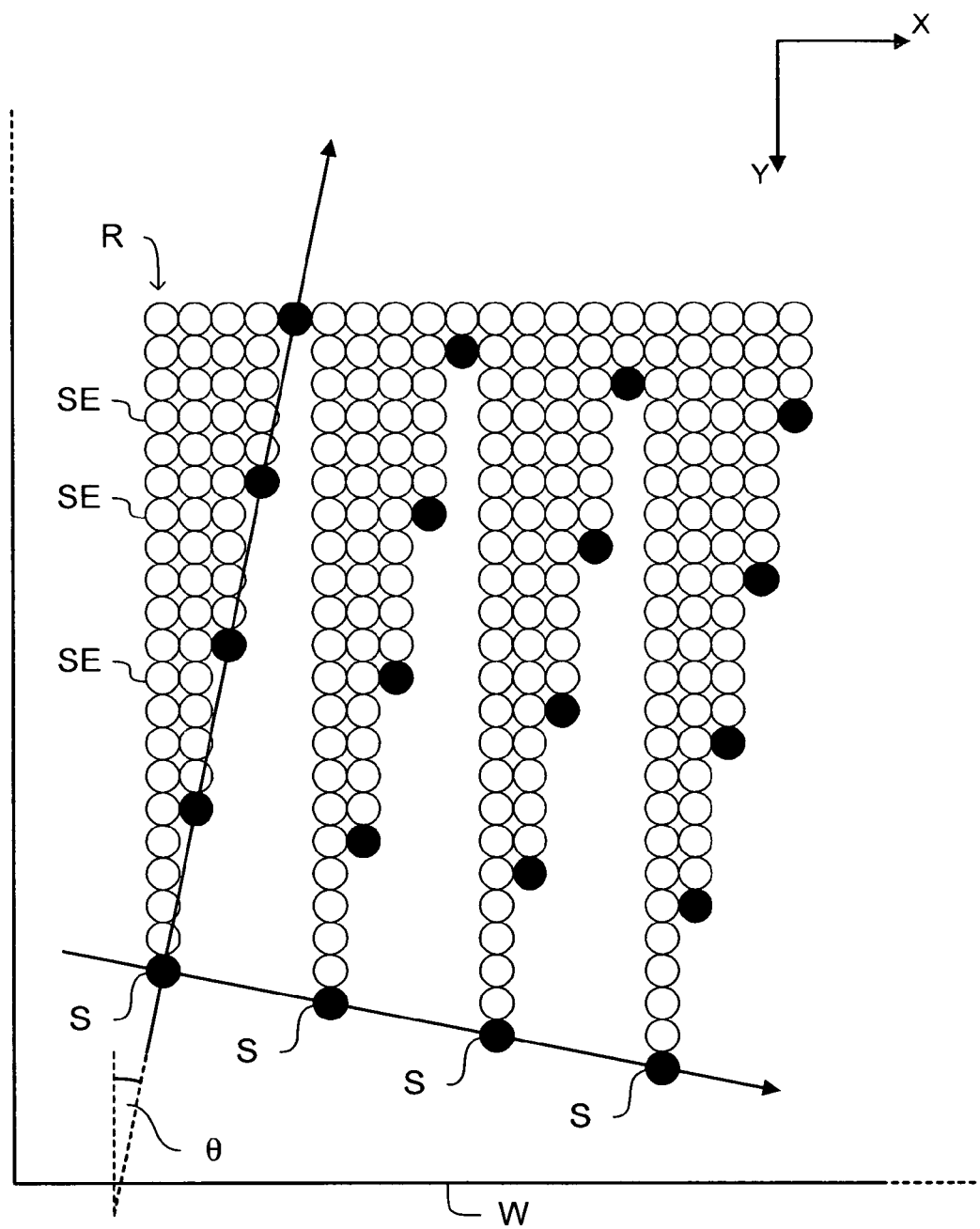
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
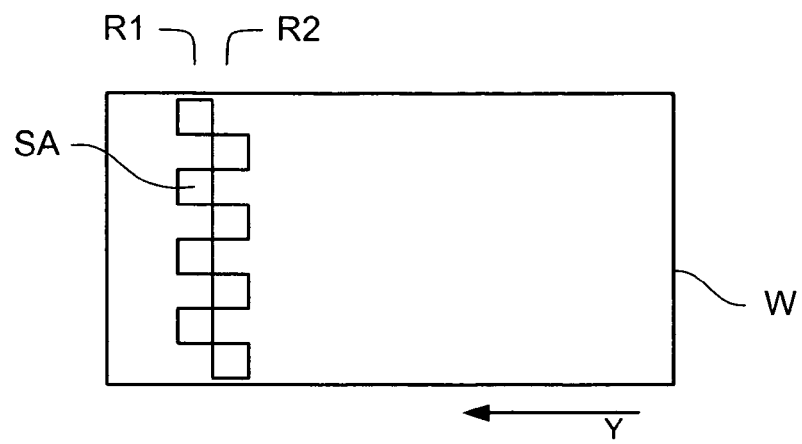
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
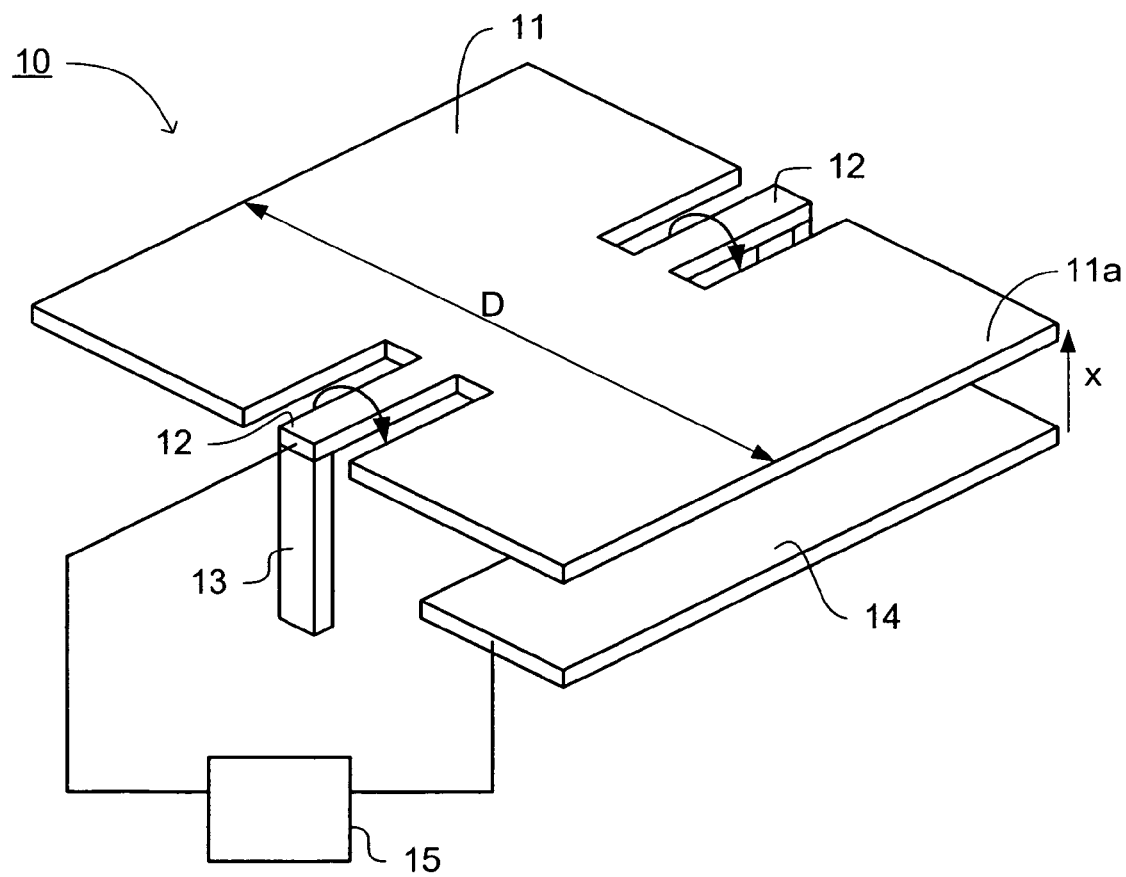
FIG. 5 depicts an arrangement of an individually controllable element and its actuator system, according to one embodiment of the present invention.

FIG. 5 depicts an arrangement for an individually controllable element for use in a patterning array. The individually controllable element 10 includes a reflector 11, for example a planar surface formed from a metal such as aluminum, and hinges 12 mounted to supports 13 that can be fixed relative to the remainder of the array of individually controllable elements. As depicted, the reflector 11 and the hinges 12 can be integrally formed. It should be appreciated that, for clarity, only a single individually controllable element is depicted. In practice, a plurality of such elements would be provided to form an array, arranged such that the reflectors of each element are substantially co-planar. Furthermore, the hinges of adjacent individually controllable elements can be connected to each other and/or connected to a common support. In general, the reflectors and hinges of all of the individually controllable elements in an array can be formed from a single sheet of metal that is etched to remove the portions necessary in order to leave the desired arrangement of reflectors and hinges. Furthermore, it should be appreciated that the supports 13 depicted in FIG. 5 for the hinges are schematic and that, in practice, the supports for all of the individually controllable elements within an array can be formed from a single layer of material formed below the material layer used to form the reflectors and the hinges, that is etched appropriately to provide sufficient space for the reflectors to be displaced.

The individually controllable element 10 can be actuated by means of an electrostatic actuator. This is established by providing an electrode 14 below one end 11a of the reflector 11 and providing a voltage difference between the electrode 14 and the reflector 11 using a controller 15. Accordingly, the end 11a of the reflector 11 adjacent the electrode 14 is attracted to the electrode 14, resulting in the reflector 11 rotating about the hinges 12.

The electrostatic force is proportional to dU/dx, where U=CV2/2, in which V is the voltage difference between the electrode 14 and the reflector 11 and C is the capacitance of the actuator. The capacitance C is proportional to 1/x, where x is the separation of the end 11a of the reflector 11 from the electrode 14. Accordingly, the force is proportional to 31 1/x2. For small angles, the gap x is approximately x0–φD/2, where φ is the reflector tilt angle, D is the width of the reflector perpendicular to the axis of rotation of the reflector and x0 is the separation between the end 11a of the reflector 11 and the electrode 14 at zero voltage, namely when there is no voltage difference between the end 11a of the reflector and the electrode 14 and, accordingly, the electrostatic actuator exerts no force on the reflector.

On the other hand, the force exerted on the reflector by the deformation of the hinge, which acts to return the reflector to its zero voltage position is proportional to the reflector tilt angle φ. As explained above, for small angles, the reflector tilt angle φ is proportional to the displacement (x−x0) of the end 11a of the reflector 11 from the zero voltage position.

Figure 6:
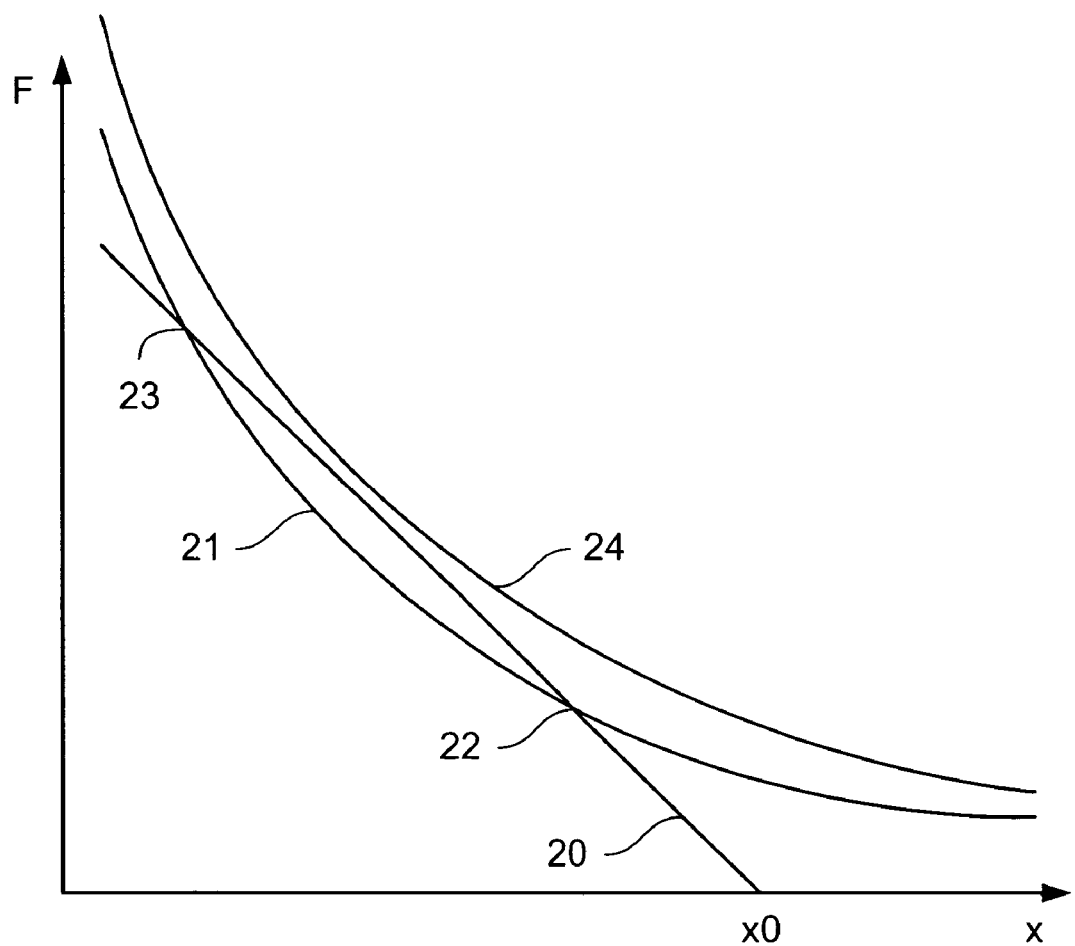
FIG. 6 depicts the relationship between the displacement of a reflector of an individually controllable element, such as that depicted in FIG. 5, and the forces acting upon it.

FIG. 6 depicts the relationship between the forces exerted on the reflector and the position of the end 11a of the reflector, according to one embodiment of the present invention. As depicted by the straight line 20, the force exerted on the reflector 11 by the hinges increases in proportion with the displacement from the zero voltage position x0 and is zero at the zero voltage position x0. Curve 21 depicts the electrostatic force exerted on the reflector by the electrostatic actuator for a given voltage. As shown, there are two equilibrium positions 22,23. The first equilibrium position 22 is stable and the second equilibrium position 23 is unstable. Curve 24 depicts the electrostatic forces on the reflector for a second, higher voltage. As shown, at this higher voltage, no equilibrium is reached and the mirror will snap through, namely will deflect until the end 11a of the reflector 11 comes into contact with the electrode 14. In general, as the voltage increases, the separation between the equilibrium positions decreases, which limits the speed at which the mirror can be actuated without snap-through occurring and, beyond a certain voltage, no equilibrium can be reached at all. Accordingly, the usable deflection of the reflector is limited, as is the speed at which the reflector can be actuated. Furthermore, the relationship between the voltage applied to the actuator and the mirror deflection φ that is generated is non-linear.

As is explained in more detail, with reference to the particular embodiments described below, the embodiments of present invention may not require altering the actuation of the reflector. Instead, if the force exerted on the reflector in order to bias it back towards the zero voltage position is non-linearly related to the displacement of the reflector from the zero voltage position, then the working range of the reflector and the speed of actuation can be increased.

It should be appreciated that, although the present invention is discussed below in relation to a reflector that is mounted to rotate about centrally positioned hinges, the principles of the invention can be applied to any individually controllable element that is formed from a movable reflector. In particular, the invention can also be applied to individually controllable elements that are hinged along one edge of the reflector or about a single corner of the reflector and also to reflectors that are actuated to move linearly in a direction perpendicular to the plane of the reflectors. Likewise, it should be appreciated that although the present invention is described in relation to individually controllable elements including reflectors that are actuated by electrostatic actuators, the invention is not limited to such configurations and can be used in conjunction with any form of actuator.

EMBODIMENT 1

Figure 7A:
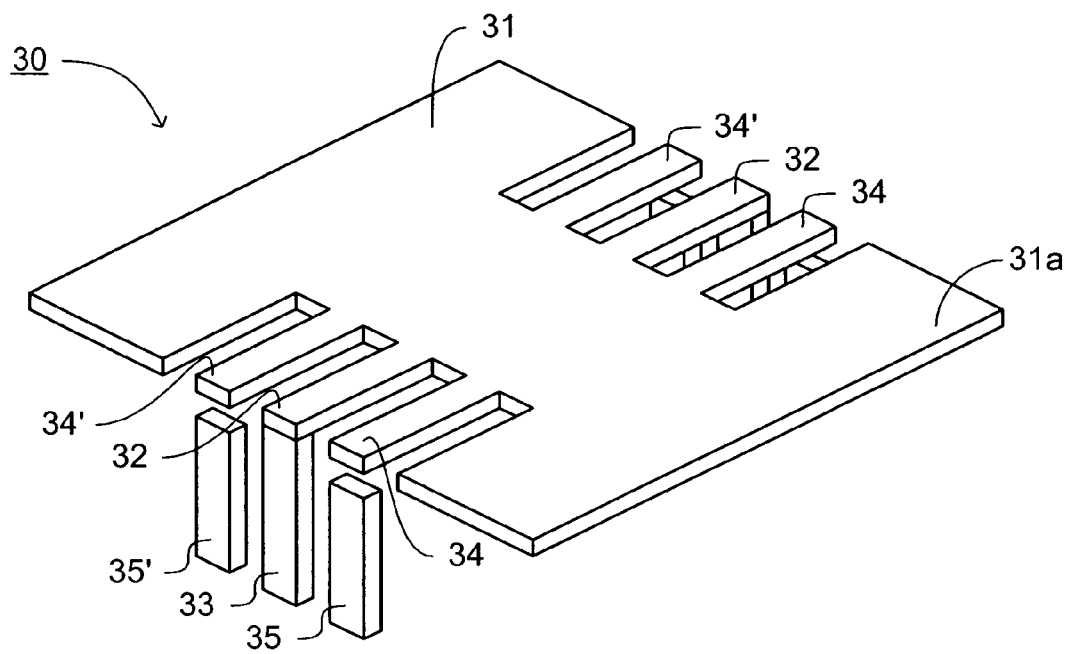
FIGS. 7a, 7b and 7c depict an individually controllable element according to a first embodiment of the present invention.
Figure 7B:
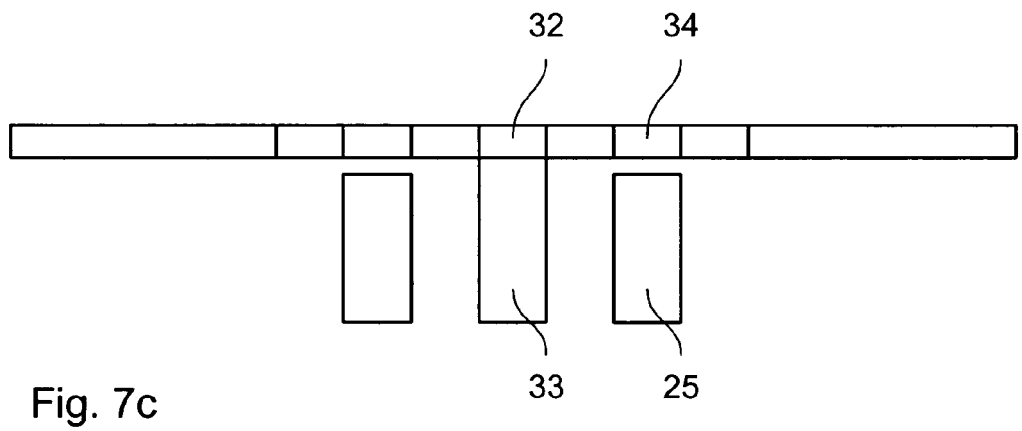
Figure 7C:
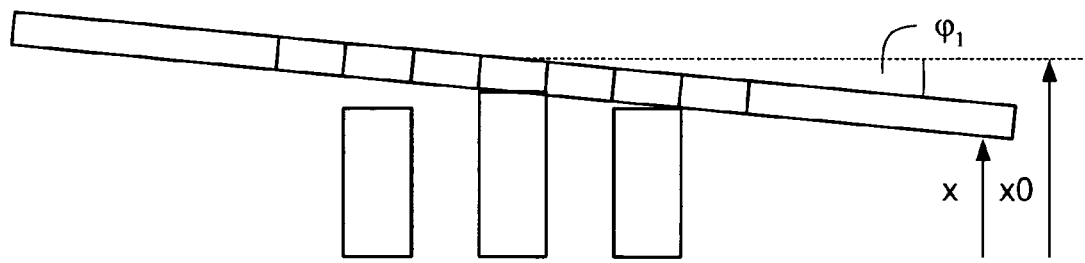

FIGS. 7a, 7b, and 7c depict a configuration of an individually controllable element, according to a first embodiment of the present invention. For clarity, the actuator system is not shown. However, it will be appreciated that it can be the same as that depicted in FIG. 5. The individually controllable element 30 is comprised of a reflector 31 mounted by hinges 32 on supports 33, for example in the same manner as discussed above in relation to FIG. 5. Accordingly, as the reflector 31 rotates about an axis through the hinges 32, the hinges deform elastically exerting a force on the reflector 31 to bias the reflector towards its original position. The force exerted by the hinges 32 is proportional to the displacement from its original position. The individually controllable element 30 further includes an interceptor arrangement 34,35 that operates in the manner discussed below.

The interceptor arrangement includes an additional support 35 that is fixed relative to the remainder of the array of individually controllable elements and a resilient member 34 that extends from the reflector 31. As depicted in FIGS. 7b and 7c, which are cross-sections of the individually controllable element depicted in FIG. 7a, the reflector 31 initially rotates about the hinge 32 without the additional support 35 and the resilient member 34 coming into contact. Accordingly, the bias force exerted on the reflector 31 to urge it to return to its original position is initially proportional to the displacement of the reflector 31. However, after an initial rotational displacement φ1 of the reflector 31, the resilient member 34 comes into contact with the additional support 35. Thereafter, for the reflector 31 to rotate further, the resilient member 34 must also be deformed. Consequently, the stiffness of the combined effect of the hinge 32 and the interceptor arrangement 34,35 is simply the stiffness of the hinge 32 up to the deflection φ1 at which the resilient member 34 makes contact with the additional support 35 and, thereafter, the stiffness is the sum of the stiffness of the hinge 32 and the stiffness of the resilient member 34.

Figure 8:
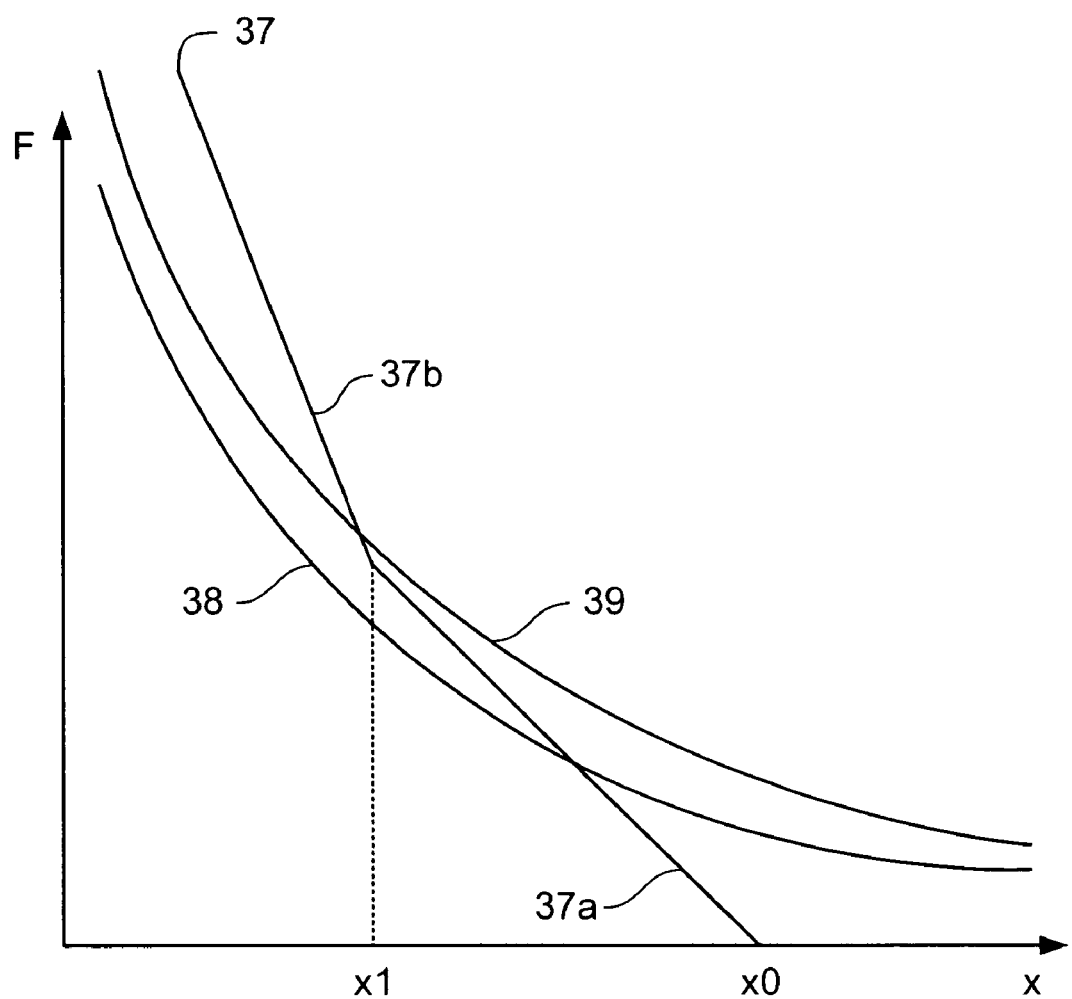
FIG. 8 depicts the relationship between the displacement of an individually controllable element as depicted in FIG. 7a and the forces exerted upon it.

FIG. 8 depicts the relationship between the forces exerted on the reflector 31 of the first embodiment of the present invention and the displacement x of the reflector 31 from the zero voltage position x0. Line 37 depicts the relationship between the bias force exerted on the reflector and its displacement. As shown, the force increases linearly at a first gradient for a first portion 37a of the line from x0 to a displacement x1, corresponding to the mirror tilt angle φ1 at which the resilient member 34 intercepts the additional support 35. Thereafter, for a second portion 37b of the line, the force increases linearly at a greater gradient, corresponding to the increased stiffness of the mirror configuration caused by the deformation of the resilient member 34. Curves 38,39 depict the electrostatic forces exerted on the reflector 31 for voltages corresponding to those of curves 21,24 depicted in FIG. 6. As shown, as a result of the increased stiffness of the spring for the second portion 37b of the bias force-deflection relationship, equilibrium can still be reached when using a higher voltage than is possible for the arrangement depicted in FIG. 5. Furthermore, the separation between the stable equilibria and the associated unstable equilibria is increased. Consequently, with an arrangement, such as depicted in FIGS. 7a, 7b and 7c, the usable range of deflection of the reflector is increased and the speed at which the reflector can be actuated is increased. Furthermore, the relationship between the voltage applied to the electrostatic actuator and the consequent mirror deflection $\phi$ can be made more linear. Accordingly, it can be possible to provide sufficient accuracy of control of the reflector, at least within a given working range, using an approximation based on a linear function.

It should be appreciated that, although the individually controllable element 30 depicted in FIG. 7a is symmetric about the axis about which the reflector 31 rotates, this need not be the case. In particular, FIG. 7a depicts an individually controllable element 30 having resilient member 34' arranged to interact with additional support 35' if the reflector 31 rotates about the hinges 32 in the opposite sense to that discussed above. The additional resilient members 34' can be omitted, for example if the reflector 31 is only to be actuated to rotate in a single direction. Likewise, although the individually controllable element 30 depicted in FIG. 7a has a resilient member 34 on either side of the reflector 31, adjacent each of the hinges 32, the individually controllable element 30 can be constructed to only include a single resilient member for intercepting an additional support. For example, such an interceptor arrangement 34,35 can be provided only on a single side of the reflector. Alternatively or additionally, a resilient member can be arranged at the end 31a of the reflector. Such an arrangement maximizes the separation of the resilient member from the axis of rotation of the reflector 31, maximizing the increase in stiffness of the reflector arrangement when it comes into contact with a corresponding additional support for a given size and material of resilient member.

In one example, the one or more resilient members can be formed from the same material as the reflector 31 and/or the hinge 32. In particular, as depicted in FIG. 7a, the resilient members 34 can be integrally formed with the reflector 31 and the hinges 32. Alternatively or additionally, one or more resilient members can be formed separately and/or from a different material.

It should be appreciated that the increase in stiffness provided by the one or more resilient members 34 when it comes into contact with the additional support 35 will be dependent on the material used to form the one or more resilient members, the size of the one or more resilient members and the distance of the one or more resilient members from the axis of rotation of the reflector 31.

EMBODIMENT 2

Figure 9:
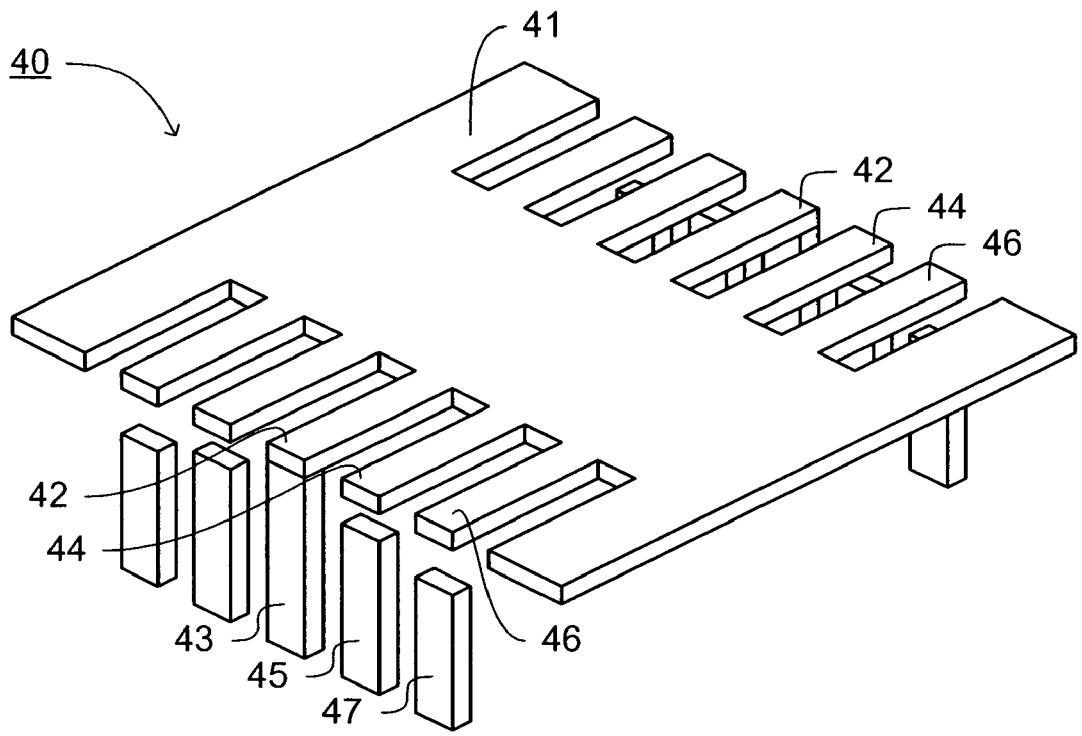
FIG. 9 depicts a second embodiment of an individually controllable element according to the present invention.

FIG. 9a depicts an arrangement of an individually controllable element, according to the second embodiment of the present invention. The second embodiment is a variation of the first embodiment, and only the differences thereof will be discussed. It should be appreciated that any variations discussed above in relation to the first embodiment can also be applicable to the second embodiment.

As depicted, the individually controllable element 40 includes a reflector 41 mounted by hinges 42 to first supports 43. The individually controllable element further includes a first set of resilient members 44 that interact with a first set of additional supports 45 after the reflector 41 has rotated by a first amount. Accordingly, the stiffness of the configuration is initially provided by the deformation of the hinges 42, and thereafter by the combination of the deformation of the hinges 42 and the deformation of the first set of resilient members 44. The individually controllable element 40 further includes a second set of resilient members 46 and an associated second set of additional supports 47. The second set of resilient members 46 and the second set of additional supports 47 are configured such that they come into contact after the reflector 41 has rotated by a second amount after the first set of resilient members 44 have come into contact with the first set of additional supports 45. Accordingly, a third stage of rotation of the reflector 41 is provided in which the stiffness is increased further, provided by the deformation of the hinges 42, and the first and second sets of resilient members 44,46. Subsequently, the maximum voltage that can be used before reaching a point at which no equilibrium can be reached can be increased further and the separation between the stable and unstable equilibria can be further increased, resulting in a further increase in the usable range of deflection of the reflector and a further increase in the possible speed of actuation. Furthermore, the relation between the voltage applied to the electrostatic actuator and the mirror deflection can approximate a linear relationship even more closely.

It should be appreciated that further improvements can be made by providing further resilient members and associated additional supports that sequentially intercept as the reflector rotates further.

EMBODIMENT 3

Figure 10:
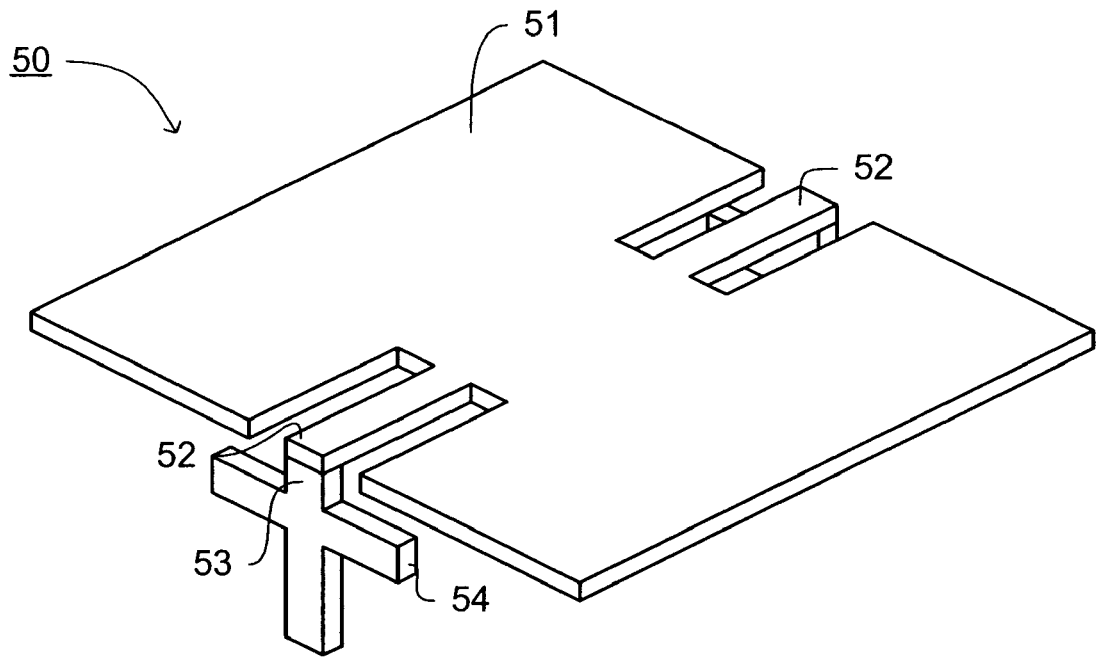
FIG. 10 depicts a third embodiment of an individually controllable element according to the present invention.

FIG. 10 depicts an individually controllable element 50, according to a third embodiment of the present invention. The third embodiment is a variation of the first embodiment of the present invention and only the differences thereof will be described. It should be appreciated that variations of the first embodiment can also be applicable to third embodiment.

As depicted the individually controllable element 50 includes a reflector 51 rotatable about hinges 52 mounted to supports 53. As with the first embodiment, the individually controllable element of the third embodiment is configured such that after a given rotation of the reflector 51 an interceptor arrangement is configured such that an additional force is exerted on the reflector 51 by a resilient member such that the effective stiffness of the reflector arrangement increases for any further deflection. Whereas in the first embodiment, the resilient member is provided to the reflector and interacts with a support that is fixed relative to the remainder of the array of individually controllable elements, according to the third embodiment, the resilient member 54 is mounted to the remainder of the array of individually controllable elements. For example, as depicted, the resilient member 54 is mounted to the support 53 and interacts with the reflector 51 and is deformed by it when the reflector rotates beyond an initial rotation.

It should be appreciated that, as with the second embodiment, a plurality of resilient members can be provided to the array of individually controllable elements and configured such that, as the reflector 51 rotates, the reflector 51 successively intercepts the plurality of resilient members, successively increasing the stiffness of the reflector arrangement.

EMBODIMENT 4

Figure 11A:
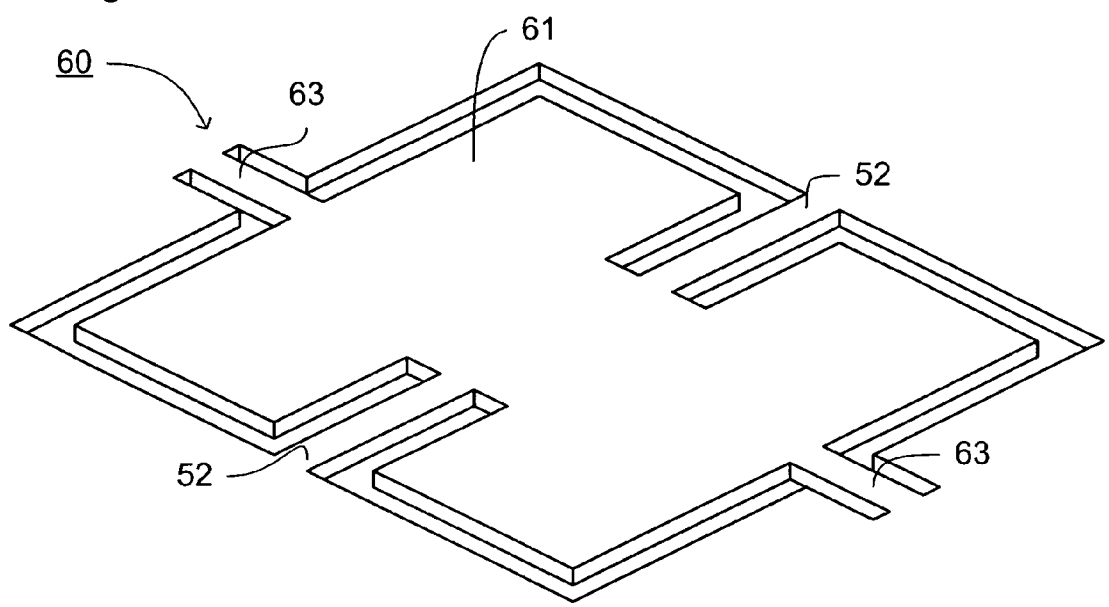
FIGS. 11a, 11b and 11c depict a fourth embodiment of an individually controllable element according to the present invention.
Figure 11B:
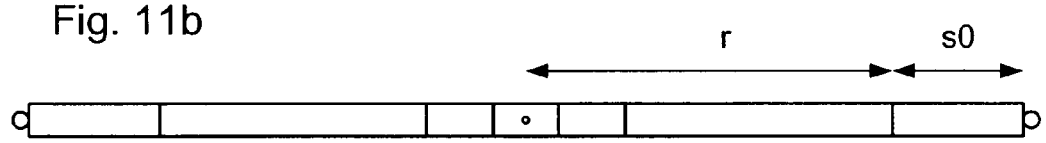
Figure 11C:
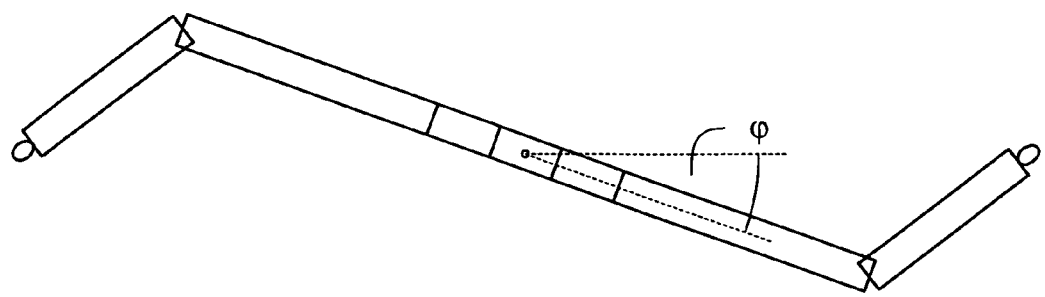

FIGS. 11a, 11b, and 11c depict an individually controllable element 60, according to a fourth embodiment of the present invention. Much of the fourth embodiment is similar to the embodiments discussed above, and only the differences thereof will be discussed. It should be appreciated that variations applicable to the first, second and third embodiments discussed above can also be applicable to the fourth embodiment.

As depicted, the individually controllable element 60 of the fourth embodiment includes a reflector 61 rotatably mounted on hinges 62. In the arrangement depicted in FIG. 11a, the reflector 61 and the hinges 62 are integrally formed from a single layer of material that has been etched with an appropriate pattern, in the manner discussed above. In the fourth embodiment, a restrictor 63 is provided that exerts an additional force on the reflector 61 in order to make the relationship between the displacement of the reflector 61 and the bias force exerted on it, urging it to return to its zero voltage position. As shown, the restrictor 63 can be at least one resilient element 63 that is stretched when the reflector 61 rotates. Although the forces exerted by the resilient elements 63 depicted vary linearly with the extension of the resilient elements 63, the moment exerted on the reflector 61 by the resilient elements 63 does not have a linear relationship with the rotational displacement of the reflector 61. This is both because the relationship between the rotational displacement of the reflector 61 and the linear extension of the resilient elements 63 is non-linear and because the angle of application of the force by the resilient element 63 relative to the plane of the reflector 61, and therefore its moment about the axis of rotation of the reflector 61, changes as the reflector 61 rotates. In particular, for an arrangement in which the diameter of the reflector 61 is 2r, such that the separation between the axis of rotation of the reflector 61 and the point of connection of the resilient member 63 to the reflector 61 is r, and the resilient member has length s0 when the reflector is at the zero voltage position, the moment exerted by the spring at a deflecting angle φ will be proportional to:

$$-(-2r^2+2r^2\cos(\phi)-2rs0+2r\cos(\phi)s0-s0^2)\sin(\phi-\arctan(r\sin(\phi)/(-r+r\cos(\phi)-s0))$$

The function above is non-linear and results in a continuously changing stiffness of the reflector configuration whereas the arrangements of the first, second and third embodiments result in discontinuous changes in the effective stiffness of the reflector configuration.

It should be appreciated that variations of the fourth embodiment are possible. In particular, although as depicted in FIG. 11a the resilient members can be formed integrally with the reflector 61 and the hinges 62, the resilient members can also be formed separately and/or from a different material. Similarly, although the arrangement depicted in FIG. 11a includes two resilient members 63 arranged symmetrically at the axis about which the reflector 61 rotates, an individually controllable element can be provided having a single such resilient member.

EMBODIMENT 5

Figure 12A:
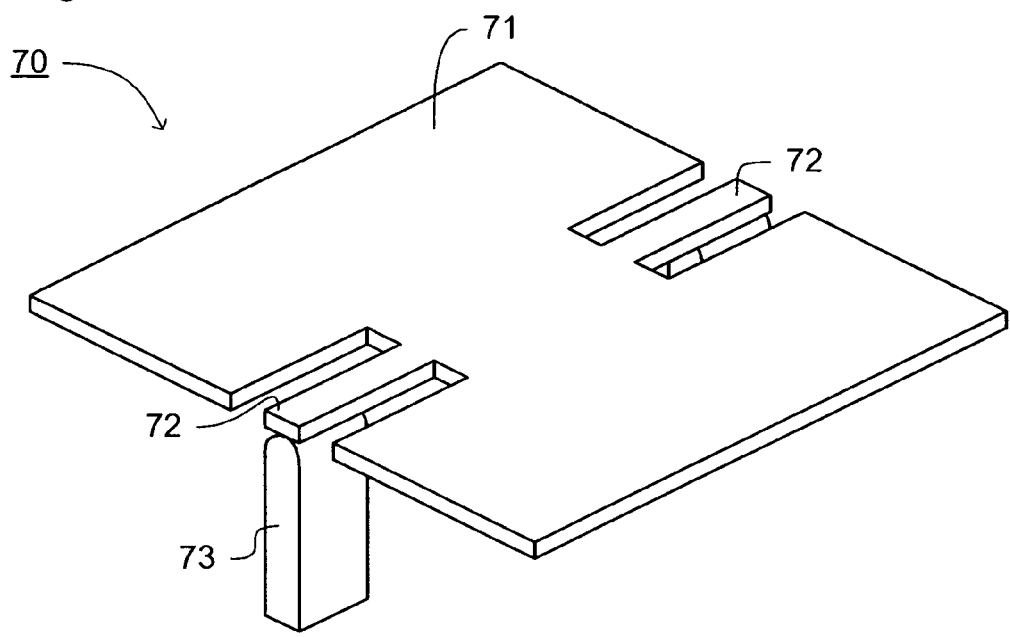
FIGS. 12a, 12b and 12c depict a fifth embodiment of an individually controllable element according to the present invention.
Figure 12B:
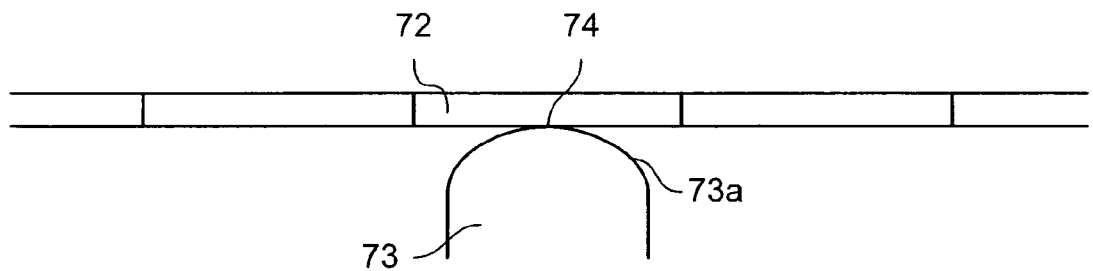
Figure 12C:
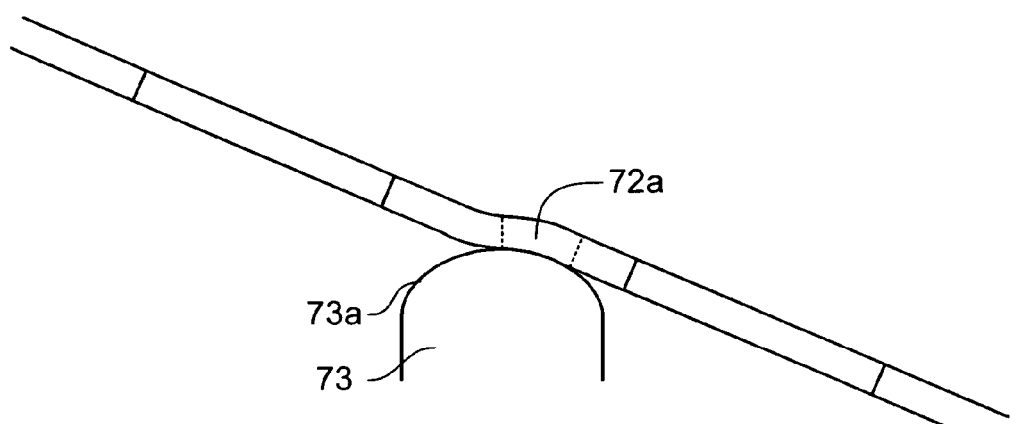

FIGS. 12a, 12b, and 12c depict a fifth embodiment of the present invention. Much of the fifth embodiment can be the same as the first, second, third and fourth embodiments, and only the differences thereof will be discussed. Likewise, it should be appreciated that variations of the first to fourth embodiments discussed above can also be applicable to the fifth embodiment.

FIG. 12a depicts an individually controllable element 70 according to the fifth embodiment. As depicted, the individually controllable element 70 includes a reflector 71 rotatably mounted by hinges 72 to supports 73. As depicted in FIG. 12b, the hinges 72 are connected to an upper surface 73a of the support 73 at a point of contact 74. As shown, the upper surface 73a of the supports 73 can have a rounded profile that makes contact with the hinges 72. As the reflector 71 rotates, the hinge 73 is constrained by the connection of the hinge to the point of contact 74 such that a portion 72a of the hinge 72 deforms around the curved surface 73a of the support 73. The effect is that the portion 72a of the hinge 72 in contact with the support 73 can deform no further. Consequently, the effective width of the hinge 72 is decreased, resulting in an increase in the stiffness of the hinge 72. Consequently, the relationship between the force exerted on the reflector 71 by the hinge 72 and the displacement of the reflector 71 is non-linear. As with the fourth embodiment, a continuous change in the stiffness of the arrangement is provided. However, no additional components are required and, in particular, no components are required away from the hinges 72, for example at the free ends of the reflector 71, facilitating the close-packing of adjacent individually controllable elements.

It should be appreciated that the profile of the curved surface 73a of the support 73 and the proportion of the length of the hinge 72 that is in contact with the curved surface 73a of the support 73 can be selected in order to provide a desired relationship between the force exerted on the reflector 71 by the hinge 72 and the displacement of the reflector 71.

EMBODIMENT 6

Figure 13A:
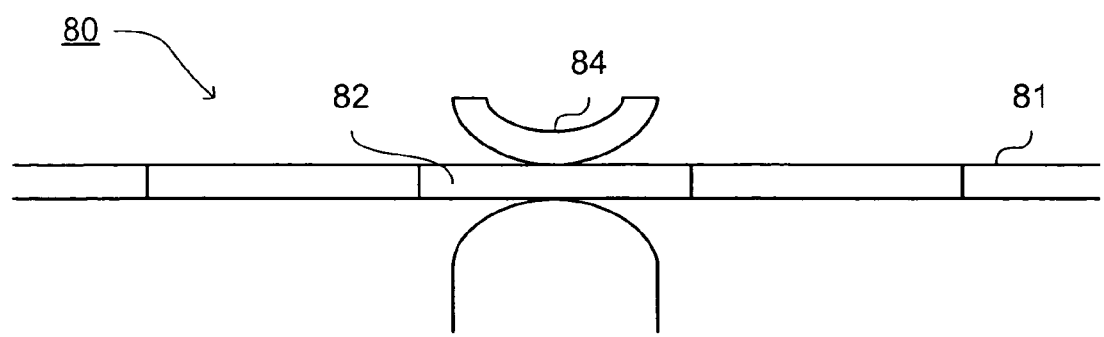
FIGS. 13a and 13b depict a sixth embodiment of an individually controllable element according to the present invention.
Figure 13B:
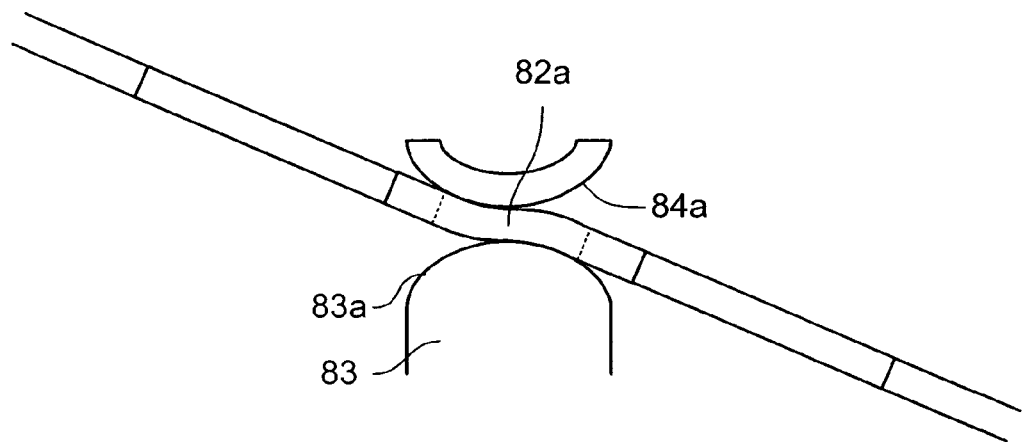

FIGS. 13a and 13b depict, in cross-section, a portion of an individually controllable element 80, according to a sixth embodiment of the invention. This arrangement is a variation of the fifth embodiment of the present invention, and only the differences thereof will be described. Likewise, variations described above applicable to the fifth embodiment can also be applicable to the sixth embodiment.

As depicted, in addition to the hinge 82 deforming around a curved surface 83a of the support 83, a restraint 84 is provided on the opposite side of the hinge 82 to the side in contact with the support 83. The restraint 84 has a curved surface 84a about which the hinge 82 also deforms. Accordingly, as the reflector 81 rotates, a portion 82a deforms about the curved surface 83a of the support 83 and the curved surface 84a of the restraint 84 and can deform no further.

It should be appreciated, therefore, that the effect is similar to the fifth embodiment, providing a hinge 82 that becomes stiffer as the reflector 81 rotates. The provision of the restraint 84 can assist in ensuring that the hinge 82 remains securely held against the curve surface 83a of the support 83. Further, in comparison with the fifth embodiment, it can be easier to provide a desired relationship between the force exerted on the reflector 81 by the hinge 82 and the displacement of the reflector because the profile of the curved surfaces 83a,84a of the support 83 and the restraint 84 can be selected separately as can be the proportion of the length of the hinge that is in contact with the support 83 and restraint 84, respectively.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An array of individually controllable elements, configured to modulate a beam of radiation, the individually controllable elements comprising:
a reflector configured to be movably mounted and to be biased towards a first position;
an actuator configured to exert a force on the reflector to displace the reflector away from a second position towards the first position;
first and second hinges, each of the first and second hinges configured to form a fingered structure that extends from a central portion of the reflector to first and second edges of the reflector, respectively, and which deform when the actuator exerts the force,
wherein the deformation of the first and second hinges provides, based on a coupling between each of the first and second hinges and their respective ones of the first and second edges of the reflector, at least a component of the force exerted on the reflector to bias the reflector away from the first position towards the second position; and
an interceptor configured not to interfere with the reflector for a first portion of a displacement of the reflector away from the second position towards the first position, and to exert an additional force on the reflector for at least a second portion of the displacement of the reflector away from the second position towards the first position.

2. The array of individually controllable elements of claim 1, wherein the first and second hinges comprise a support coupled to a substrate that encompasses the array of individually controllable elements and configured to support the reflector.

3. The array of individually controllable elements of claim 1, wherein
the additional force exerted by the interceptor is non-linearly related to the displacement of the reflector from the second position towards the first position.

4. The array of individually controllable elements of claim 1, wherein the interceptor comprises:
a resilient member, extending from the reflector, configured to contact a support after the first portion of the displacement of the reflector away from the second position towards the first position, and wherein the resilient member is configured to deform as the reflector is displaced beyond the first portion of the displacement.

5. The array of individually controllable elements of claim 1, further comprising:
a second interceptor configured not to interfere with the reflector for the first and second portions of the displacement of the reflector away from the second position towards the first position, and to exert an additional force on the reflector for at least a third portion of the displacement of the reflector away from the second position towards the first position.

6. The array of individually controllable elements of claim 1, wherein the hinge is configured to increase in stiffness as the reflector is displaced away from the second position towards the first position.

7. The array of individually controllable elements of claim 6, wherein the increase in stiffness comprises a restriction of an affected portion of the hinge that deforms as the reflector is displaced away from the second position towards the first position.

8. The array of individually controllable elements of claim 7, wherein:
the hinge is configured to be mounted to a support fixed within the array of individually controllable elements; and
a first part of the hinge is fixed to the support and at least a second part of the hinge is configured to deform for a given rotation of the reflector, relative to the array of individually controllable elements, until the second part of the hinge is in contact with the support, whereupon the hinge is configured to deform no further.

9. The array of individually controllable elements of claim 8, wherein each of the individually controllable elements further comprise:
a restraint that is mounted to the hinge on an opposite side of the hinge to the support; and
wherein the restraint is configured to deform a third part of the hinge for a given rotation of the reflector, relative to the array, until the third part of the hinge is in contact with the restraint, whereupon the hinge is configured to deform no further.

10. A lithographic apparatus, comprising an array of individually controllable elements configured to modulate a beam of radiation prior to projection of the beam onto a substrate, wherein the individually controllable elements comprise:
a reflector configured to be movably mounted and to be biased towards a first position; and
an actuator configured to exert a force on the reflector to bias the reflector away from a second position towards the first position;
first and second hinges, the first and second hinges each configured to form a fingered structure that extends from a central portion of the reflector to first and second edges of the reflector, respectively, and configured to deform when the actuator exerts the force, wherein the deformation of the first and second hinges provides, based on a coupling between each of the first and second hinges and their respective ones of the first and second edges of the reflector, at least a component of the force exerted on the reflector to bias the reflector away from the first position towards the second position; and an interceptor configured not to interfere with the reflector for a first portion of a displacement of the reflector away from the second position towards the first position, and to exert an additional force on the reflector for at least a second portion of the displacement of the reflector away from the second position towards the first position.

11. A device manufacturing method, comprising:

modulating a beam of radiation using an array of individually controllable elements, the modulating being performed through, movably mounting a reflector to each individually controllable element, the reflector is biased towards a first position, exerting a force on the reflector using an actuator configured to bias the reflector away from a second position towards the first position, deforming first and second hinges when the actuator exerts the force, the first and second hinges, forming a fingered structure that extends from a central portion of the reflector to first and second edges of the reflector, respectively, and providing, based on a coupling between each hinge and its respective edge of the reflector, at least a component of the force exerted on the reflector to bias the reflector away from the first position towards the second position, using an interceptor configured not to interfere with the reflector for a first portion of a displacement of the reflector away from the second position towards the first position, and to exert an additional force on the reflector for at least a second portion of the displacement of the reflector away from the second position towards the first position, and sending control signals to the actuators of the individually controllable elements to set the reflectors to desired displacements; and projecting the modulated beam of radiation onto a substrate.

12. An integrated circuit device manufactured according to the method of claim 11.

13. A flat panel display manufactured according to the method of claim 11.

14. The array of individually controllable elements of claim 1, wherein the force exerted on the reflector is non-linearly related to a displacement of the reflector away from the second position towards the first position.

15. The array of individually controllable elements of claim 1, wherein the individually controllable elements, actuator, and hinge reside on a common substrate.

* * * * *